(12) United States Patent
Nelson

(10) Patent No.: US 9,429,310 B2
(45) Date of Patent: Aug. 30, 2016

(54) FABRIC-ENCAPSULATED LIGHT ARRAYS AND SYSTEMS FOR DISPLAYING VIDEO ON CLOTHING

(71) Applicant: Erogear, Inc., San Francisco, CA (US)

(72) Inventor: Anders Kristofer Nelson, San Francisco, CA (US)

(73) Assignee: Erogear, Inc., San Francisco, CA (US)

( * ) Notice: Subject to any disclaimer, the term of this patent is extended or adjusted under 35 U.S.C. 154(b) by 156 days.

(21) Appl. No.: 14/279,736

(22) Filed: May 16, 2014

(65) Prior Publication Data

US 2014/0340877 A1 Nov. 20, 2014

Related U.S. Application Data

(60) Provisional application No. 61/824,876, filed on May 17, 2013.

(51) Int. Cl.

| | | |
|---|---|---|
| *F21V 33/00* | (2006.01) | |
| *F21V 21/002* | (2006.01) | |
| *F21V 23/00* | (2015.01) | |
| *F21V 23/04* | (2006.01) | |
| *H05K 1/02* | (2006.01) | |
| *F21Y 101/02* | (2006.01) | |
| *F21Y 105/00* | (2016.01) | |
| *G09F 9/33* | (2006.01) | |

(Continued)

(52) U.S. Cl.
CPC ......... *F21V 33/0008* (2013.01); *F21V 21/002* (2013.01); *F21V 23/005* (2013.01); *F21V 23/0435* (2013.01); *H05K 1/0281* (2013.01); *A41D 27/085* (2013.01); *F21V 33/008* (2013.01); *F21Y 2101/02* (2013.01); *F21Y 2105/001* (2013.01); *G09F 9/33* (2013.01); *G09F 2021/023* (2013.01); *H05K 1/038* (2013.01); *H05K 2201/09263* (2013.01); *H05K 2201/10106* (2013.01)

(58) Field of Classification Search
CPC ............... F21V 21/08; F21V 33/0008; F21V 23/0435; F21V 21/145; F21V 21/002; A41D 27/085
USPC ........................................................ 362/103
See application file for complete search history.

(56) References Cited

U.S. PATENT DOCUMENTS

| | | |
|---|---|---|
| 4,774,434 A | 9/1988 | Bennion |
| 5,917,149 A | 6/1999 | Barcley et al. |

(Continued)

OTHER PUBLICATIONS

KIPO, International Search Report and Written Opinion for PCT/US2014/038436, dated Oct. 28, 2014.

*Primary Examiner* — Karabi Guharay

(74) *Attorney, Agent, or Firm* — PatentBest; Andrew McAleavey

(57) ABSTRACT

Flexible, fabric-encapsulated light arrays particularly suitable for use in clothing are disclosed. The light arrays are light-emitting diode (LED) arrays disposed on flexible printed circuit boards (PCBs). The flexible PCBs include substantially sinusoidal metal contact traces, along which the LEDs are attached at an angle preselected to minimize stresses in the expected directions of bending. The PCBs may also include enlarged metal contact pads and a coverlay arrangement to prevent delamination. The light arrays are contained within pockets that may be made of conductive fabric in order to form a Faraday cage. Systems and methods are also disclosed that use local and wide-area controllers to send words, images, and video to the light arrays substantially in real time.

21 Claims, 11 Drawing Sheets

(51) Int. Cl.
   *H05K 1/03*   (2006.01)
   *G09F 21/02*  (2006.01)
   *A41D 27/08*  (2006.01)

(56) References Cited

U.S. PATENT DOCUMENTS

| | | |
|---|---|---|
| 7,030,855 B2 | 4/2006 | Metcalf |
| 7,229,385 B2 | 6/2007 | Freeman et al. |
| 7,787,240 B2 | 8/2010 | Swain |
| 7,789,520 B2 | 9/2010 | Konig et al. |
| 7,854,684 B1 | 12/2010 | Freeman et al. |
| 8,020,327 B2 | 9/2011 | Schellingerhout et al. |
| 8,049,747 B2 | 11/2011 | Arneson et al. |
| 8,622,578 B2 | 1/2014 | De Samber et al. |
| 8,732,866 B2 | 5/2014 | Genz et al. |
| 8,779,694 B1 * | 7/2014 | Lindblad et al. .............. 315/312 |
| 8,842,443 B2 | 9/2014 | Lim et al. |
| 2004/0047146 A1 | 3/2004 | Galoob et al. |
| 2011/0102304 A1 | 5/2011 | Nelson |
| 2011/0213664 A1 | 9/2011 | Osterhout et al. |
| 2012/0099298 A1 | 4/2012 | Hsu |
| 2013/0077289 A1 | 3/2013 | Gridley |

* cited by examiner

FABRIC-ENCAPSULATED LIGHT ARRAYS AND SYSTEMS FOR DISPLAYING VIDEO ON CLOTHING

CROSS-REFERENCE TO RELATED APPLICATIONS

This application claims priority to U.S. Provisional Patent Application No. 61/824,876, filed May 17, 2013, the contents of which are incorporated by reference herein in their entirety.

This application is also related to a U.S. patent application entitled "Flexible LED Light Arrays," given docket no. EG-2-US, and filed on the same date as this application. The contents of that application are incorporated by reference herein in their entirety.

BACKGROUND OF THE INVENTION

1. Field of the Invention

The invention relates to clothing with LED light arrays and to systems for displaying video on clothing.

2. Description of Related Art

For many years, manufacturers have sought to incorporate lights into clothing. Most commonly, the lights have been in the form of light-emitting diodes (LEDs). U.S. Pat. No. 4,774,434 to Bennion is one early example of such a design, which includes a number of LEDs arranged on a flexible substrate and encapsulated to protect them. Typically, these items of lighted clothing have been viewed as novelty items, although a few references, such as U.S. Patent Application Publication No. 2004/0047146 to Galoob et al., disclose lighted items of clothing that can be used as safety gear.

While the concept of integrating an LED lighting system into a piece of clothing is straightforward, its execution is not. Despite attempts over the years, almost no lighted clothing products are regularly sold, and very few products of this type have made it to market. A number of cost, engineering, and manufacturing issues have prevented most products from succeeding.

One of the major engineering issues is that clothing is very flexible and is often subjected to a great deal of wear. Thus, any electronic element embedded in a piece of clothing is subjected to wear, stresses, strains, and environmental exposure. Reliability becomes a problem; under adverse conditions, LEDs may simply "pop off" of a printed circuit board, and control electronics may stop functioning.

U.S. Patent Application Publication No. 2011/0102304, which is incorporated by reference in its entirety herein, is the work of the present inventor and discloses LED lighting circuits for clothing that use rigid printed circuit boards. Rigid printed circuit boards may improve the survivability of the LEDs and the control electronics, but they are not necessarily ideal for the very flexible environment of clothing.

LED arrays that use flexible printed circuit boards would seem ideal for use in clothing, but engineering them to survive the clothing environment and integrating them well with clothing are difficult.

SUMMARY OF THE INVENTION

One aspect of the invention relates to articles of clothing with embedded light arrays. The light arrays are encapsulated within fabric pockets in the articles of clothing, and the fabric pockets may be made of conductive fabric, in order to shield the light arrays from electromagnetic interference. The arrays themselves comprise a number of light-emitting diodes (LEDs) arrayed on a flexible printed circuit board (PCB), such as a polyimide PCB.

The PCB itself includes a number of features to reduce strain and improve its ability to withstand flexure. For example, the LEDs are arrayed along substantially sinusoidal metal contact lines, and are oriented at an angle preselected to minimize stresses in an expected direction or directions of bending or flexure. In some embodiments, that angle may be approximately 45° with respect to the horizontal. Contact between the traces and the LEDs is made in a rigid area directly beneath each LED. Additionally, copper contact pads on various layers of the PCB are enlarged in order to resist delamination.

Another aspect of the invention relates to control and display systems and methods for controlling LED light arrays in clothing. In systems and methods according to this embodiment of the invention, a light array or a group of light arrays are in wireless communication with a controller, which may be a smartphone with an application or "app" allowing it to communicate with and control the light arrays. The controller is adapted to direct the LED light arrays to display words, images, or video substantially in real time.

Yet another aspect of the invention relates to systems and methods for distributing words, images, and video to a plurality of light arrays in clothing. A plurality of nearby light arrays may order and orient themselves into a group such that each array is controlled to display a portion of a larger word, image, or video and the entire word, image, or video is displayed by the group. Words, images, and video may be shared between users, and in some embodiments, an event manager or area controller may distribute words, images, and video to large numbers of light arrays in clothing.

A further aspect of the invention relates to systems that integrate multiple LED light arrays. These systems include at least two light arrays. Each of the at least two light arrays comprises a flexible PCB on which a number of LEDs are provided, connected to one another via a plurality of essentially sinusoidal contact traces. The LEDs are positioned at an angle preselected to minimize stresses in expected directions of bending or flexure. A master control board is attached to or integrated with a first of the at least two light arrays. The master control board comprises at least one communications circuit and at least one LED driver circuit to drive the LEDs on the first of the at least two light arrays. A slave control board is attached between the first of the at least two light arrays and a second of the at least two light arrays. Connected between the first and the second of the at least two light arrays, the slave control board is in electrical communication with the master control board to receive instructions and comprises one or more LED driver circuits to drive the LEDs on the second of the at least two light arrays. In some embodiments, the master control board and the slave control board are rigid PCBs.

Another further aspect of the invention relates to flexible PCB LED light arrays that may minimize the risk of damage to vias in bending. These PCB LED light arrays comprise a flexible PCB substrate. One or more vias are provided that extend through at least some layers of the flexible PCB substrate. A component is mounted on a side of the flexible PCB substrate opposite the one or more vias and provides a rigidified area. The via is located within the rigidified area provided by the component. The component itself is electrically unconnected and usually serves no purpose on the PCB other than to provide rigidity. The component may be, for example, a resistor, a capacitor, or an integrated circuit package.

These and other aspects, features, and advantages of the invention will be set forth in the description that follows.

BRIEF DESCRIPTION OF THE DRAWING FIGURES

The invention will be described with respect to the following drawing figures, in which like numerals represent like features throughout the invention, and in which.

DETAILED DESCRIPTION

Figure 1:
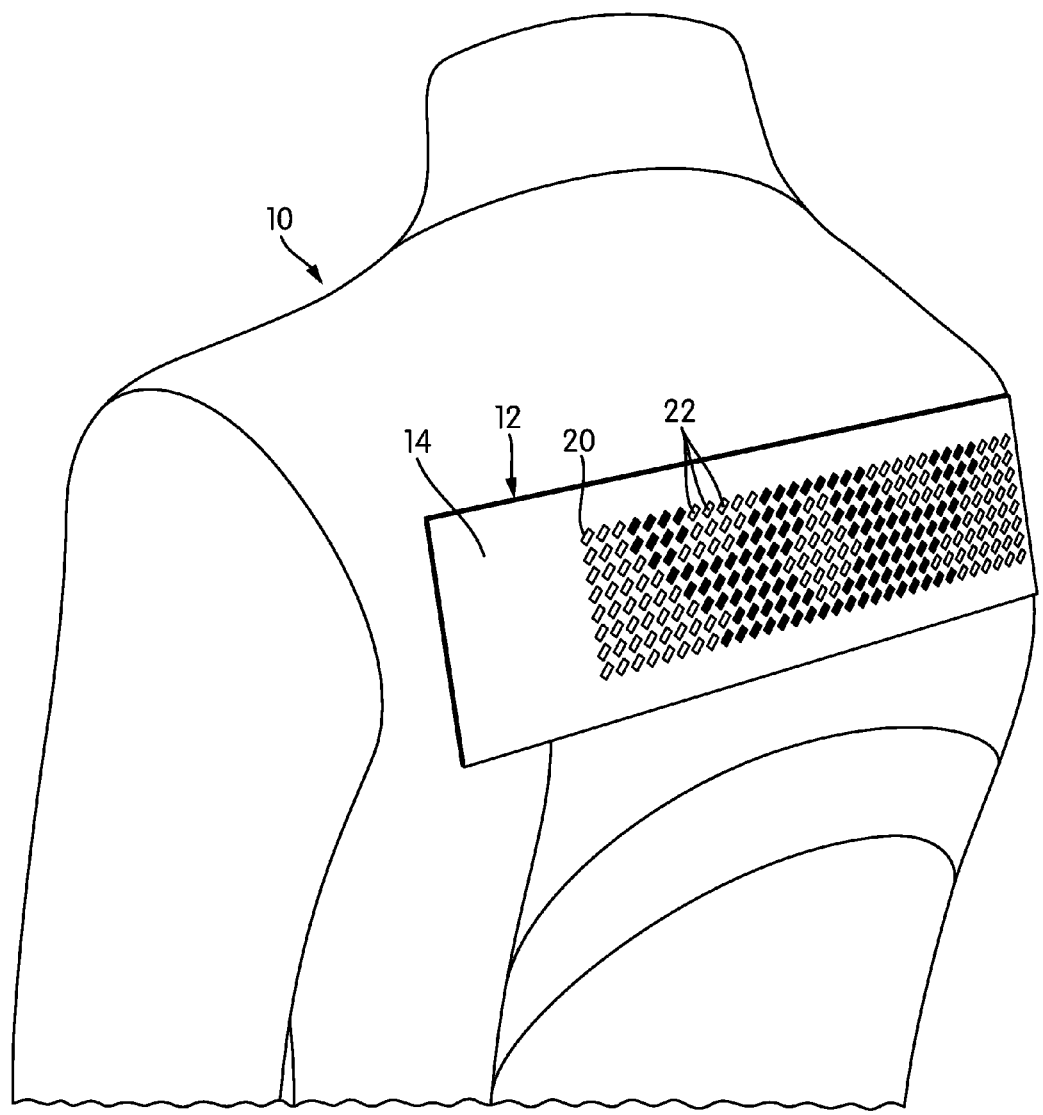
FIG. 1 is a perspective view of a piece of clothing with an integrated LED light array encapsulated within a fabric pocket.

FIG. 1 is a perspective view of a piece of clothing, generally indicated at 10, according to one embodiment of the invention. The piece of clothing 10 illustrated in FIG. 1 is a jacket or vest, although embodiments of the invention may include any type of clothing. In the illustrated embodiment, a light array 12 is attached to the clothing 10 using hook-and-loop fastener, encapsulated within a fabric pocket 14. In other embodiments, the light array 12 may be sewn or otherwise integrated into the clothing 10. As will be described below in more detail, the light array 12 is an array of light-emitting diodes (LEDs) that are individually logically addressable, such that the array is capable of displaying, words, shapes, patterns, or real-time video. The light array 12 of the illustrated embodiment includes 256 individual LEDs 22, although any number of LEDs 22 may be included.

Figure 2:
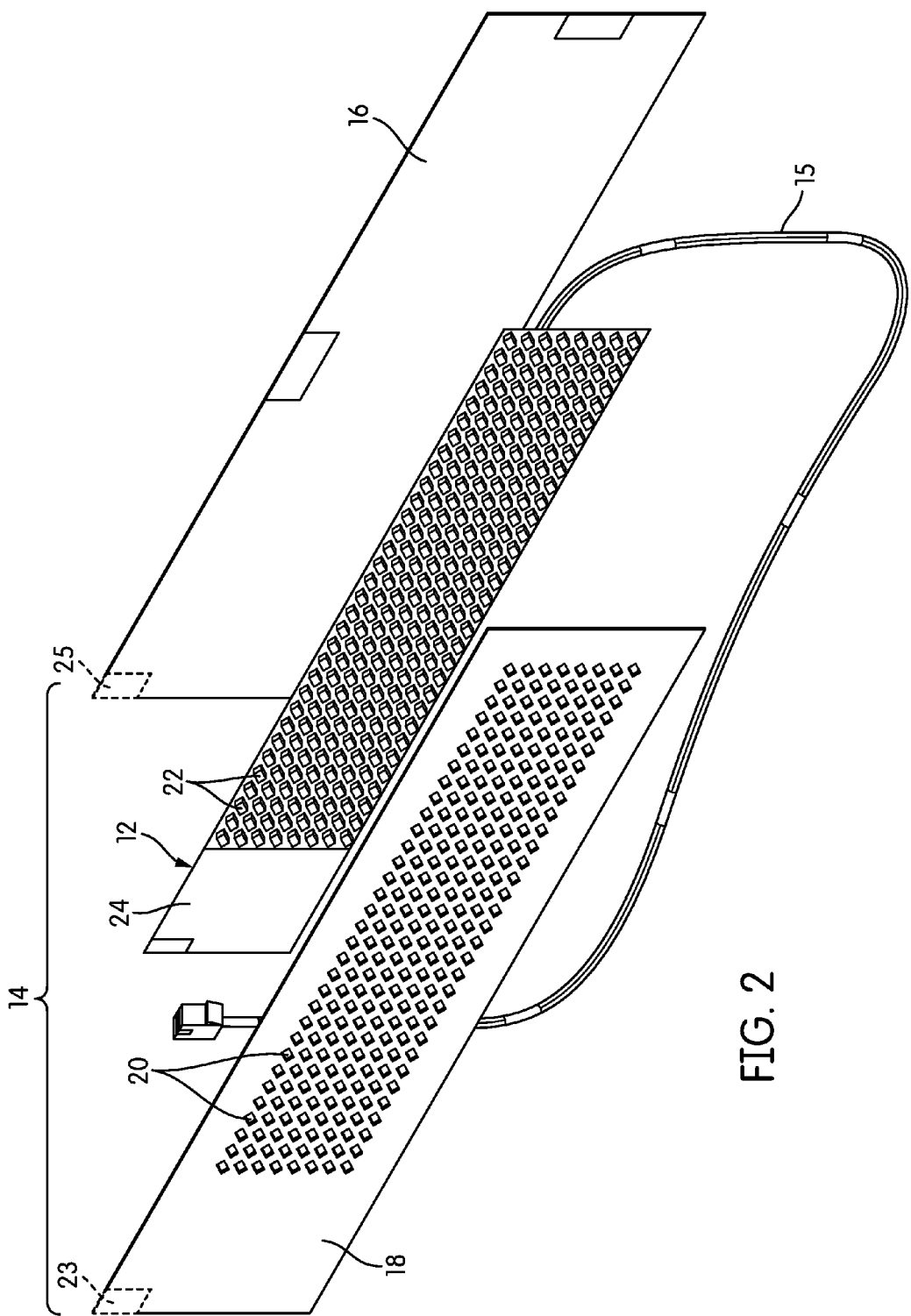
FIG. 2 is an exploded view of the fabric pocket and the LED array of FIG. 1.

FIG. 2 is an exploded view of the fabric pocket 14 and light array 12. In this embodiment, the fabric pocket 14 includes an underlayer 16 that is positioned below the light array 12 and an upper fabric layer 18 designed to be positioned on top of the light array 12. The upper fabric layer 18 includes a number of openings 20 whose size, shape, and pitch are defined so as to allow the individual LEDs 22 of the light array 12 can protrude through the upper fabric layer 18. The underlayer 16 and upper fabric layer 18 may be made of any type of fabric, and in some embodiments, there may be additional layers of fabric on top of or beneath the upper fabric layer 18. In some embodiments, it may be helpful if the fabric layers 16, 18 are made of an electrically conductive fabric. A fabric may be made conductive using any conventional technique. As one example, a sheet of fabric may be coated with a conductive polymer. Electrically conductive fabric encapsulating the light array 12 may act as a Faraday cage, shielding the light array 12 from external electromagnetic radiation and preventing any signals or radiation from the light array 12 from interfering with other elements. However, an electromagnetically transparent window is generally provided in the fabric pocket 14 to allow for communication with external devices, as will be explained below in more detail. The light array 12 may be electrically grounded or anchored to the fabric pocket 14.

In many embodiments, a conductive adhesive may be used over the majority of the surface area of the light array 12 to physically secure it to the fabric layers 16, 18 so that the fabric layers 16, 18 do not shift relative to the light array 12. The electromagnetically transparent or permissive areas may be established, for example, by masking an area and using nonconductive adhesive, rather than conductive adhesive, within the masked area. FIG. 2 illustrates two nonconductive areas 23, 25 that are aligned on the upper fabric layer 18 and the lower fabric layer 16 and establish the electromagnetically transparent window.

Figure 3:
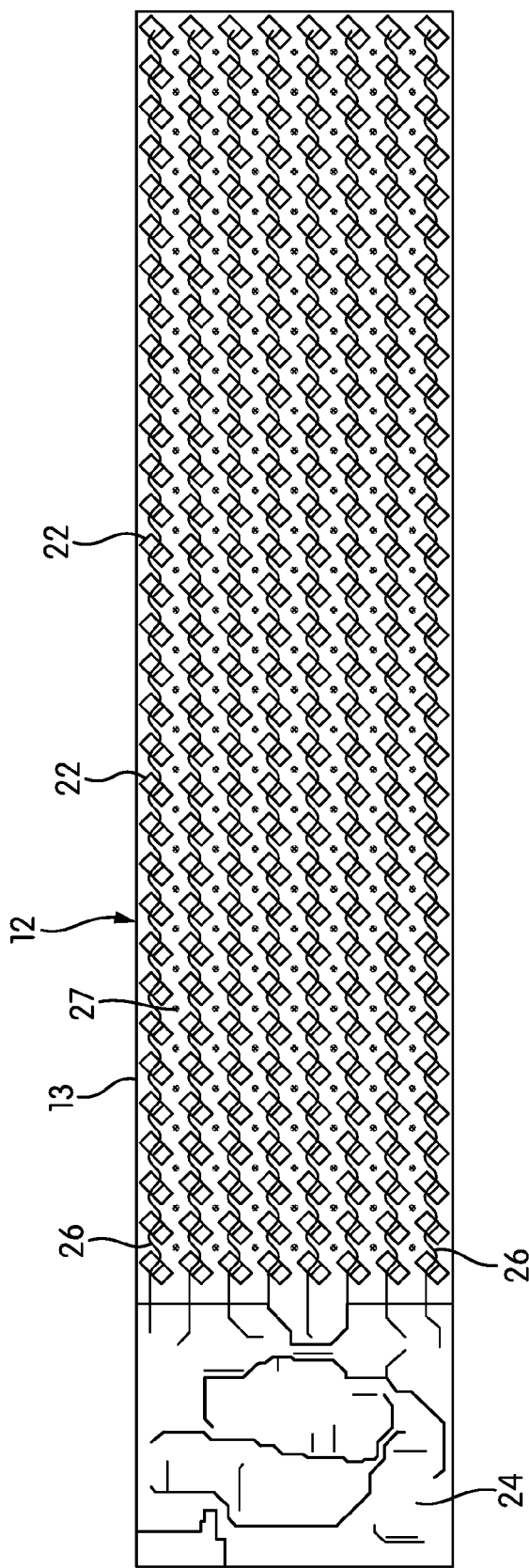
FIG. 3 is a schematic diagram of a first side of the LED array of FIG. 1.

FIG. 3 is a schematic illustration of a first side of the light array 12. The light array 12 comprises a flexible printed circuit board (PCB) 13, for example, made of polyimide film, on which a plurality of LEDs 22 are installed. The light array 12 includes a control circuit area 24 which may be folded under the portion of the PCB 13 that carries the LEDs 22 so as to reduce the footprint of the light array 12. Additionally, the control circuit area 24 of the illustrated embodiment contains no components on its upper side, which would allow another light array 12 to be tiled over the control circuit area 24, so that two adjacent arrays appear to be continuous. Other adaptations to minimize the footprint of the light array 12 may be made; for example, the power cord 15 (best seen in FIG. 2) may exit from the rear of the array 12 within its dimensions, rather than from one edge.

The light array 12 includes several features that improve its ability to handle flexure and the resulting stresses and strains. As can be seen in FIG. 3, the LEDs 22 are arranged in rows and columns. Each row of LEDs includes a metal contact trace 26 that is sinusoidal in shape. The sinusoidal shape of the metal contact traces 26 provides strain relief. Additionally, physical and electrical contact between the LEDs 22, the PCB 13, and the metal contact traces 26 is made only within the rigidified area directly beneath the LEDs 22.

The LEDs 22 themselves are oriented at an angle of about 45° with respect to the horizontal in the illustrated embodiment. The orientation of the LEDs 22 may help to relieve stresses in bending. In other embodiments, the orientation of the LEDs 22 may be chosen based on the initial configuration of the light array 12 and the expected direction of bending.

On the PCB 13, metal contact pads make electrical contact with components mounted on the PCB 13, including the LEDs 22. The metal used for the conductive pads is typically copper, although it may be any other metal or conductive material. The general construction of vias and contact pads is well known in the art, and any conventional arrangements or configurations may be used.

Figure 4:
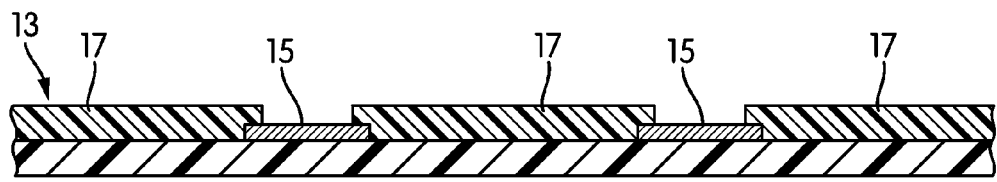
FIG. 4 is a schematic cross-sectional view of the printed circuit board (PCB) of the LED array, illustrating enlarged metal contact pads.

FIG. 4 is a schematic cross-sectional view of a portion of the PCB 13, illustrating the arrangement of the conductive pads 15 and the coverlay 17. In PCBs 13 according to embodiments of the invention, the dimensions of the conductive pads 15, typically made of copper, are increased about 0.1 to 0.15 mm on each side compared with the surface area of normal conductive contact pads on a comparable rigid PCB. Additionally, the coverlay 17 encroaches a minimum of about 0.05 to 0.1 mm onto the pads for adhesion.

The illustration of FIG. 4 schematically shows only two layers on one side of the PCB 13. Because PCBs 13 generally have several layers, often on both sides of the PCB 13, if electrical contact is necessary between layers, a via is usually used. Vias are holes in the PCB 13 that are plated with gold, copper, aluminum, or another conductive metal. Because they are holes, vias may act as stress concentrators when the PCB 13 is loaded in bending. Additionally, when the PCB 13 flexes around a via, the metal plating in the via may simply delaminate. Thus, in embodiments of the invention, the PCB 13 may be designed to minimize the risk of damage to or because of the vias.

Figure 5:
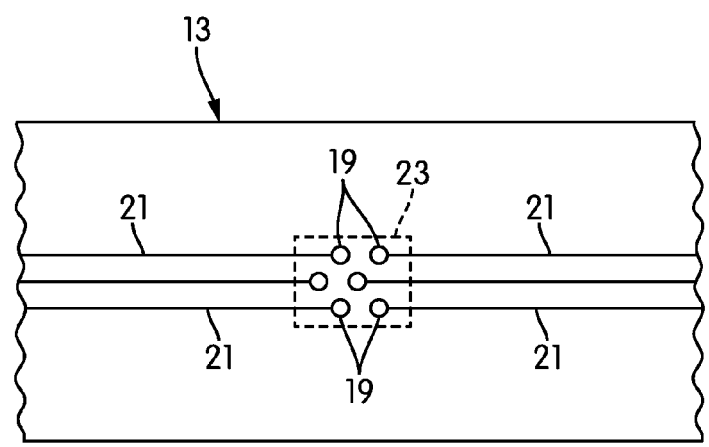
FIG. 5 is a schematic plan view of a PCB, illustrating a group of vias and an arrangement for selectively rigidifying the area around the vias to prevent damage.

FIG. 5 is a schematic diagram of a portion of the PCB 13 illustrating a grouping of vias 19 and their respective metal contact traces 21. In embodiments of the invention, when vias are necessary, it is advantageous to group those vias 19 so that they are placed close to one another. It is also helpful if a stiffener or a passive component is mounted on the opposite side of the PCB 13. The footprint or outline 23 of the passive component is shown in FIG. 5, and as is also shown, all of the vias 19 in the group are placed within the footprint 23 of the passive component.

The passive component 23 may be a surface mount device (SMD), such as a large resistor, capacitor, chip package, or other such component, and may be soldered to the PCB 13 to connect it mechanically to the PCB. However, it should be understood that in most embodiments, this passive component 23 will be electrically unconnected to the other components on the PCB 13, and will serve no electrical purpose. Instead, its presence and mounting on the PCB 13 simply provide mechanical reinforcement and rigidity in the area of the vias 19 and prevent bending. Moreover, using a large, passive device may be cheaper, and from a manufacturability standpoint, easier, than rigidifying the PCB 13 in a conventional way. However, in some embodiments, instead of a passive component 23, a stiffener, such as a piece of FR4 board, may be adhered to the PCB 13.

In addition to vias for electrical connectivity, the PCB may have any number of through holes 27 (best seen in FIG. 3) drilled or otherwise formed in it. Through holes 27 may be positioned, for example, between lines of LEDs 22, or anywhere else there is space, and may allow for more airflow through the PCBs, thus potentially making the pieces of clothing 10 more comfortable to wear.

In other embodiments, certain other adaptations may be made. For example, the control circuit area 24 need not be on one end of the light array 12, and may instead be positioned at the center of the PCB 13, which may allow multiple PCBs 13 to be laid next to one another while minimizing space between adjacent LEDs 22 from different PCBs 13.

Additionally, while the PCB 13 of the illustrated embodiment is rectangular with straight sides, that need not be its shape in all embodiments. For example, in some embodiments, one or more of the edges may be scalloped. Scalloped edges may allow two adjacent PCBs 13 to be placed adjacent to and in registration with one another, and may also have certain other advantages. Of course, the PCB 13 need not be rectangular, and could instead have any number of sides. For example, a pentagonal, hexagonal, or septagonal PCB could be made in some embodiments of the invention, as will be described below in more detail.

Figure 6:
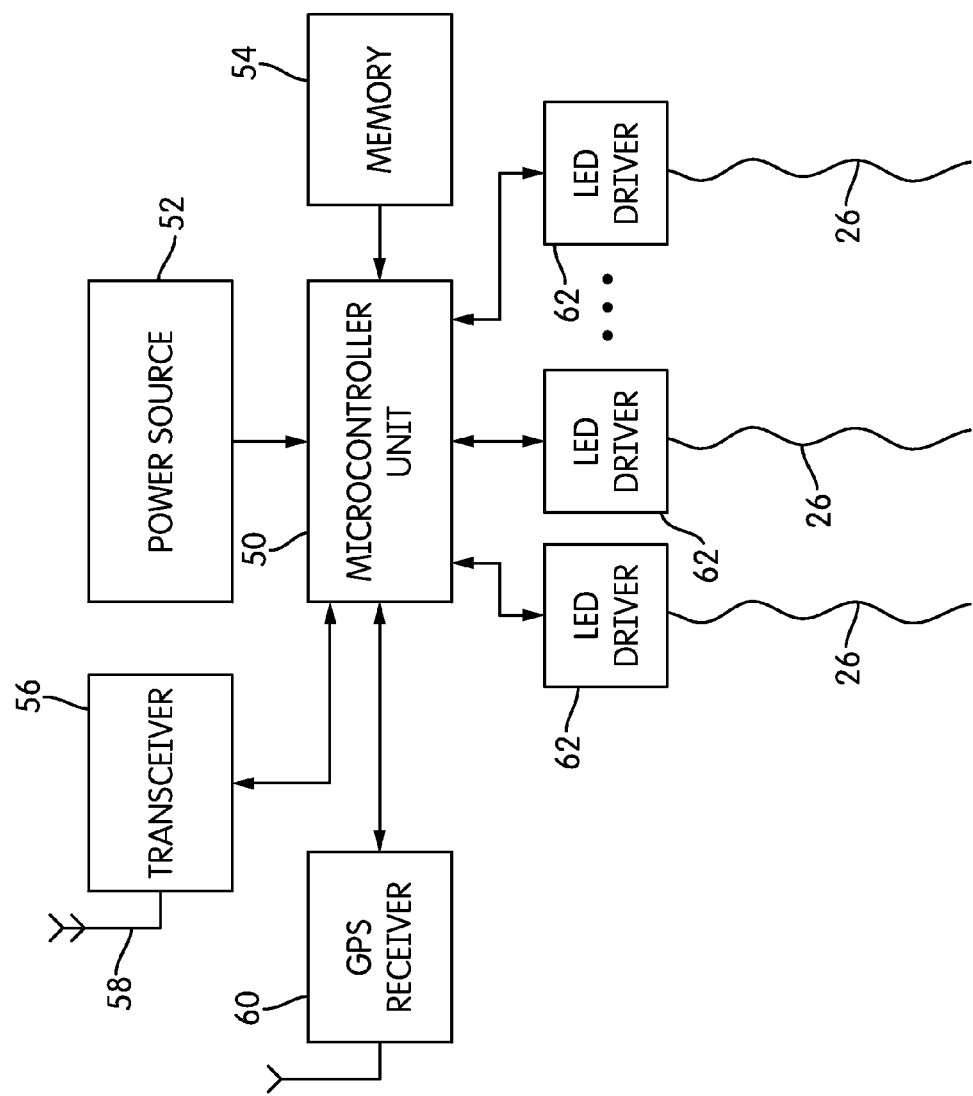
FIG. 6 is a schematic diagram of the logic and communication components of the LED array of FIG. 1.

FIG. 6 is a schematic diagram of the control electronics for the light array 12. The function of the light array 12 is controlled by a microcontroller unit (MCU) 50, which draws power from an appropriate power source 52. The MCU 50 may, for example be a Model PIC32MX1 microprocessor from Microchip Technology (Chandler, Ariz., United States). The power source 52 would typically be a direct current (DC) power source, such as a battery or set of batteries, but in some embodiments, the ultimate power source may be a higher voltage alternating current (AC) source, coupled with a transformer/rectifier to bring the supplied power to acceptable DC voltage and current levels.

The MCU 50 is connected to a memory 54. In most embodiments, the memory would be a solid-state memory, such as Flash memory. However, other forms of memory may be used. The amount of memory in each light array 12 will vary from embodiment to embodiment, depending on the capabilities of the array 12, the complexity of the video or patterns each is intended to show, the number of LEDs in the light array 12 and other conventional factors. In the illustrated embodiment, with 256 LEDs in the array, 64 megabits has been found to be adequate.

The MCU 50 is connected to the outside world and receives instructions from external programming devices via a transceiver unit 56 that is coupled to an antenna 58 of an appropriate configuration. In the illustrated embodiment, the transceiver unit 56 is a BLUETOOTH® transceiver unit capable of receiving instructions and transmitting feedback. However, in other embodiments, other types of transceivers may provide different wireless and other communication capabilities. For example, conventional IEEE 802.11a/b/g/n WiFi transceivers may be included to provide higher bandwidth or longer-range communication, as may conventional cellular chipsets and transceivers for wireless data communication using a cellular network. Although only one transceiver 56 is shown in FIG. 6, the light array 12 may have any number of transceivers 56 for different communication modalities. Of course, some transceivers 56 may require more power than others, which would, in turn, require a larger power source 52. Although optional, the light array 12 may also include components like a GPS receiver 60.

The above assumes that the light array 12 will communicate wirelessly. This may simplify the construction of garments, because it reduces or eliminates the need to access individual light arrays 12 once they are sewn into or otherwise secured in their respective fabric pockets 14. However, in some cases, instead of or in addition to wireless communications via transceivers 56, the light array 12 could also include a Universal Serial Bus (USB) port, or another kind of physical connector, for data transfer.

In order to activate and control the LEDs 22, the MCU 50 communicates with a plurality of LED drivers 62, each of which controls a matrix of LEDs 22. As is common, the LEDs 22 of the light array 12 are driven in scanned matrices, and each of the LED drivers 62 has a number of output lines to control a matrix of LEDs. While not shown in the schematic view of FIG. 6, there may be a number of components, such as transistors, that regulate the power going to the LEDs 22 and perform other conventional and well-known functions.

In some embodiments, the videos, patterns, or words displayed by the light array or arrays 12 may be permanently set in the firmware of the arrays 12. For example, where the light arrays 12 are used in uniforms or safety clothing, the arrays 12 could be configured to display one of a pre-set number of words, such as "POLICE," "FIRE," "EMT," "PARAMEDIC," and the like. This could be done by providing a physical switch somewhere in the article of clothing that the user manipulates to change the display of the light array. Decorative patterns or words could also be permanently set in the firmware of the arrays 12. In these embodiments, the words or video would generally be stored locally in the memory of the array 12.

However, in particularly advantageous embodiments of the invention, the controller that directs the light array or arrays 12 is external to the article of clothing and, as explained briefly above, communicates with it via a wireless communication protocol (BLUETOOTH, WiFi, etc.). In some cases, the controller may be a dedicated piece of hardware, although in most embodiments, it may be more advantageous for the controller to be an application or "app" that is implemented on a more general-purpose computing platform. For example, an application to control one or more light arrays 12 may be implemented on a desktop or laptop computer, on a tablet computer, or on a smartphone. More generally, any computing device that can communicate with a light array 12 and can run the application may be used.

In some cases, light arrays 12 may be made and sold in models of differing capabilities, depending at least in some part, on their communications capabilities. For example, a basic embodiment of a light array may be sold with a number of pre-programmed, selectable words or patterns available in memory, with a selector switch being used to toggle between the pre-programmed patterns. A more advanced embodiment might include a USB connector and the ability to be programmed with user-defined patterns. A "full-featured" version would include the wireless communication capabilities and other features described above.

Figure 7:
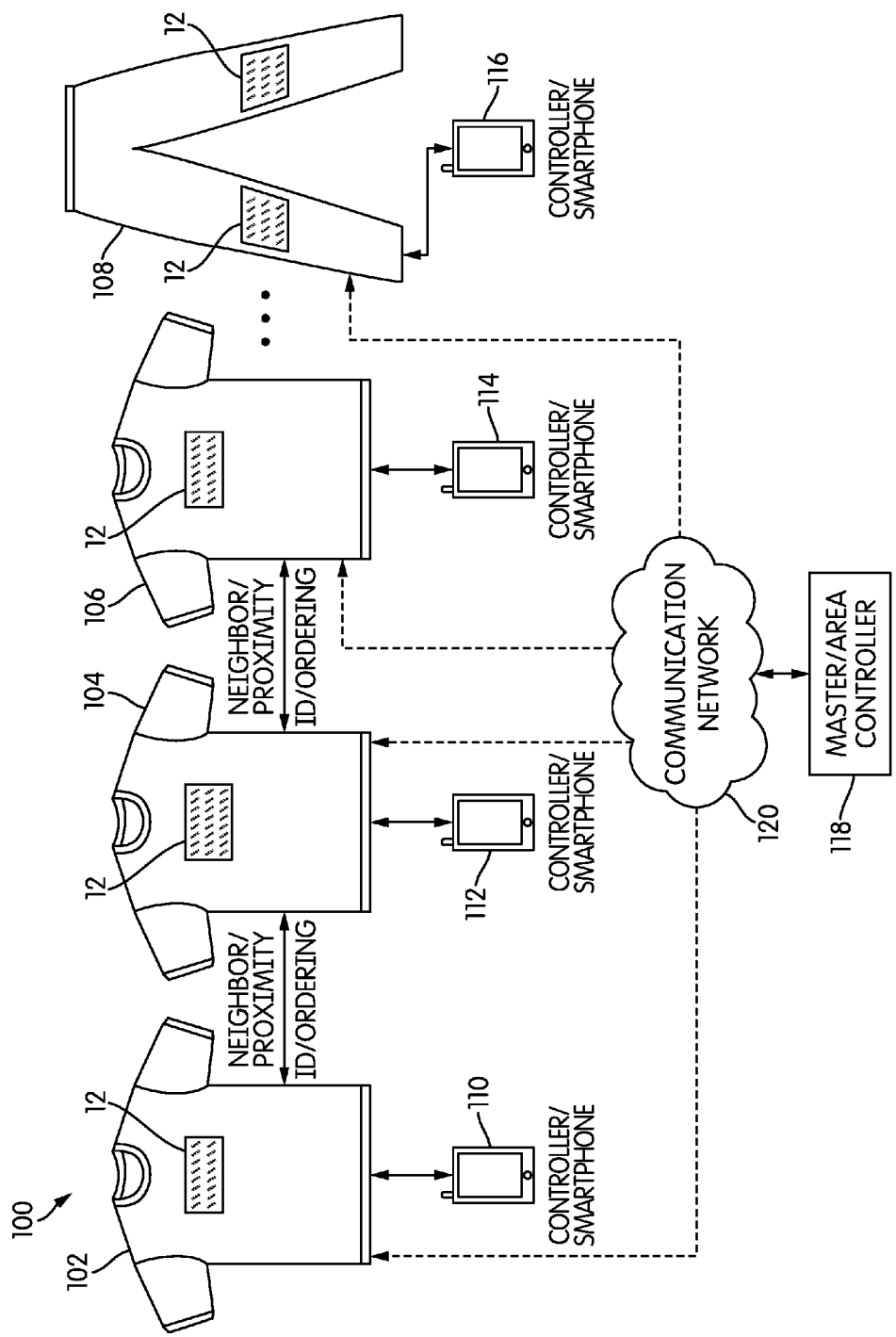
FIG. 7 is a diagram of a system for controlling light arrays according to one embodiment of the invention.

FIG. 7 is a schematic diagram of a control system, generally indicated at 100, for light arrays 12 embedded in clothing. In the illustration of FIG. 7, four pieces of clothing 102, 104, 106, 108 are shown, each of which has at least one light array 12 embedded in it. As shown, the pants 108 have two light arrays 12, one on each leg. Each light array 12 may be assumed to have the components described above, although the number of LEDs in each array, and the pitch or spacing of those LEDs, may vary.

Typically, as shown in FIG. 7, each article of clothing 102, 104, 106, 108 will have its own controller 110, 112, 114, 116. These controllers 110, 112, 114, 116 may, in some embodiments, be dedicated devices. However, for purposes of this description, unless otherwise noted, the controllers 110, 112, 114, 116 may be assumed to be smartphone computing devices, such as the Apple iPHONE® (Apple, Inc., Cupertino, Calif., United States), or other general-purpose computing devices, running software applications that allow the devices to act as controllers 110, 112, 114, 116. In a typical embodiment, each controller 110, 112, 114, 116 would be "paired" with its respective light array 12 or article of clothing 102, 104, 106, 108 in typical fashion using the Bluetooth short-range communication protocol, although in many instances, one controller 110, 112, 114, 116 may be used to control more than one article of clothing 102, 104, 106, 108.

The controllers 110, 112, 114, 116 define what word, picture, or video is to be displayed on each of the light arrays 12 and for how long, process existing words, images, and videos in other formats and from other sources to place them in a format appropriate for the light arrays 12, and transmit the image or video data to the light arrays 12 in real time. In some embodiments, the controller 110, 112, 114, 116 may be adapted to synchronize the transmission and display of certain words, images, or videos with sound, music, and other elements of an audiovisual presentation.

In some cases, if there are multiple light arrays 12 under its control, a controller 110, 112, 114, 116 may break a single image or video into multiple adjacent segments and display those adjacent image or video segments on physically adjacent light arrays 12. For example, if there are multiple light arrays 12 on a single piece of clothing 108, the controller 116 for that piece of clothing may process an incoming video signal to break it into two adjacent pieces of video suitable for playing on the adjacent arrays 12 of the piece of clothing 108. A controller 116 controlling more than one light array 12 may, of course, direct each light array 12 to play or display an entirely different image, video, or word.

The controllers 110, 112, 114, 116 may also perform conversion and optimization tasks. For example, if a video or image was not created specifically for display on one of the light arrays 12, the controller 110, 112, 114, 116 may resize or crop the video, may convert it to grayscale, and may perform gamma correction and other such tasks.

In some embodiments, the individual light arrays 12 and pieces of clothing 102, 104, 106, 108 may be configured to automatically determine if neighboring arrays are present and, if so, to order themselves by determining where they are in a larger grouping of light arrays 12 (i.e., by locating their nearest neighbors). Each array 12 may then accept and display an appropriate segment of a larger image, word, or video. Standard received signal strength indication (RSSI) techniques and, if available, GPS data, can be used for this kind of ordering. In some cases, the light arrays 12 may be adapted, e.g., by adjusting firmware, such that only light arrays 12 from the same vendor, or sold under the same brand by an OEM vendor, will cooperate to form larger display groupings.

Proximity detection may also be used with respect to the controllers 110, 112, 114, 116. For example, if two controllers 110, 112, 114, 116 are physically near one another, the users of those controllers 110, 112, 114, 116 may be given the option to share images, videos, or words for display on their respective articles of clothing 102, 104, 106, 108. In some cases, this may be simplified such that, e.g., two nearby users may "bump" their smartphones together while running the controller application and, in so doing, cause their light arrays 12 to display the same or complementary patterns. Technologies for implementing this feature are well known, and typically rely on an accelerometer to detect a movement and BLUETOOTH® or near field communication (NFC) to transfer the appropriate data. Other kinds of movements and triggers may be used to transfer information.

Although much of the above description concentrates on the use of individual controllers 110, 112, 114, 116 and their paired articles of clothing 102, 104, 106, 108, in some embodiments, words, images, and video may be distributed to mass numbers of light arrays 12 by a master or area controller 118 broadcasting over a communication network 120.

As one example, a number of patrons may be attending a sporting event in a stadium while wearing clothing 102, 104, 106, 108 that includes light arrays 12. In each case, the users may decide, by changing software settings using their controllers 110, 112, 114, 116, to receive and display words, images, and patterns transmitted (for example, using WiFi) by a master area controller 118 that is located in the stadium and is under the control of stadium, game, or team officials. Thus, a large number of adjacent patrons could be displaying the same message, or a part of a larger image, video or message.

As was noted briefly above, the controllers 110, 112, 114, 116 may be either dedicated devices or more general-purpose computing devices, like smart phones, that run software applications or apps that allow those devices to perform the functions attributed to them. As the term is used here, "software" refers to sets of machine-readable instructions that are in a machine-readable form and that, when executed, cause the machine to perform the described tasks. The machine-readable medium may be any type of non-transitory memory, including magnetic disks, optical disks, solid-state drives, programmable read-only memory, external or internal FLASH drives, or any other known form of electronic storage medium.

When software applications are used to create controller functionality, the software applications may be distributed with the light arrays 12 or articles of clothing 102, 104, 106, 108, or they may be distributed via third-party vendors, for example, specific to different types of computing devices. For example, applications for Apple devices may be distributed by Apple, Inc. through the iTUNES® store, and applications for devices running the ANDROID® operating system may be distributed via the ANDROID® store.

In the above description, it is assumed that each light array 12 has its own control circuit area 24. Various approaches for reducing the footprint of a light array 12 are described above, including placing higher-profile components on the underside of the control circuit area 24 and folding the control circuit area 24 under the main body of the light array 12.

In many embodiments, it may be helpful to separate the control circuits from the actual LED arrays, for manufacturability reasons, to reduce the footprint of the device, or to increase versatility. Additionally, in the embodiments of the light array 12 described above, each light array 12 has its own communication chipset and is a separate node for communication purposes. While effective, that setup may complicate communication with multiple arrays 12.

Figure 8:
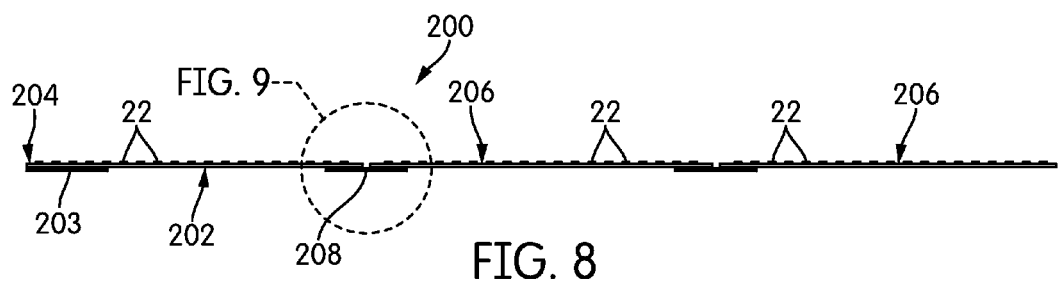
FIG. 8 is a side elevational view of a master-slave light array arrangement according to another embodiment of the invention.

FIG. 8 is a side elevational view of a master-slave set of light arrays, generally indicated at 200, according to another embodiment of the invention. In the set of light arrays 200, a master light array 202 has control circuits 203 in a control circuit area 204, including a communication chipset for BLUETOOTH®, WiFi, and/or other modes of communication; and an LED matrix driver. As shown, the master light array 202 is connected to a number of slave arrays 206. A master light array 202 may be connected to any number of slave arrays 206.

Each of the slave arrays 206 is connected to the master light array 202 and/or to other slave arrays 206 by a controller board 208. The controller board 208 would generally include much the same circuitry as the control circuits 203 of the master light array 202. However, the controller boards 208 would generally not include transceivers or receivers for external communication (e.g., via BLUETOOTH®). Instead, those features would typically be handled by the master light array 202.

The illustration of FIG. 8 is generic; as those of skill in the art will realize, master light arrays 202 may be connected to slave arrays 206 in any number of ways. Connections can be made horizontally or vertically between adjacent boards 102, 206. Horizontally, high-density surface mount device (SMD) connectors and flexible printed circuit (FPC) connectors may be used.

Figure 9:
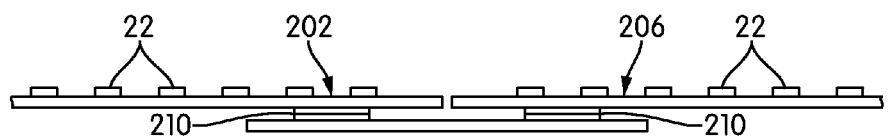
FIG. 9 is a detailed side elevational view showing a portion of FIG. 8 and illustrating one way of connecting two adjacent light arrays.

FIG. 9 is an enlarged side elevational view of an area of FIG. 8, illustrating the connection of a master light array 202. In the illustrated embodiment, a controller board 208 "bridges" between the master light array 202 and one of the slave arrays 206 vertically, and is connected electrically and mechanically between the undersides of the two boards 202, 206 by a pair of high-density surface mount connectors 210 that have corresponding male and female portions, one on each of the connecting surfaces.

The side elevational view of FIG. 8 illustrates a mode of vertical connection in which a bridge and LED array driver board 208 is connected between the undersides of two slave arrays 206 by the use of adhesive pads and spacers 210. The bridge and LED array driver board 208, which may be a rigid PCB, contains the control circuitry to control and drive the LEDs 22.

Figure 10:
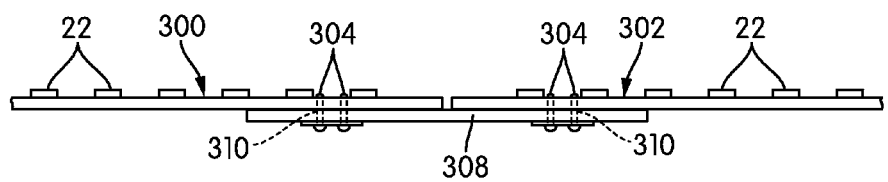
FIG. 10 is a side elevational view similar to the view of FIG. 9, illustrating another way of connecting two adjacent light arrays.
Figure 11:
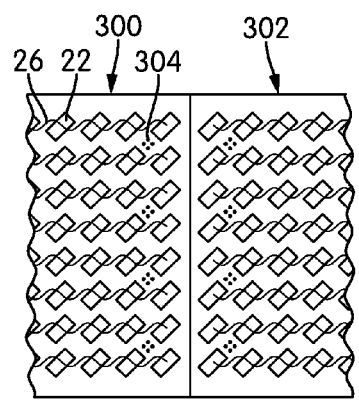
FIG. 11 is a top plan view of the connection of FIG. 10.

FIG. 10, a side elevational view, and FIG. 11, a top plan view, illustrate an alternate way of mechanically and electrically coupling LED array boards in embodiments of the invention. In the view of FIG. 10, two LED array boards 300, 302, which contain LEDs 22 and contact traces 26 but no active control circuits, may also be connected by means of groups of vertically-extending pins 304 provided on a bridge and array controller board 308. The pins 304 extend upward from the controller board 308 and through vias 310 or other types of through-holes provided in the flexible boards 300, 302. These pins may be, for example, 3-5 mm in height and spaced with a pitch of 0.050 inches or 2 mm. The number of pins 304 that are used, and the number of groups of pins 304 will depend on the number of electrical signal lines needed for connection, and the number of pins needed for a secure mechanical connection. The pins 304 may be placed in groups of, e.g., four, with the groups of pins 304 spaced evenly along the width of the joint, as shown in FIG. 11. While the pins 304 connect two array boards 300, 302, this type of connection may be used for other purposes as well.

In the embodiments of FIGS. 8-11, the slave arrays 206, 300, 302 do not contain their own control electronics. Instead, those electronics are on either the master light array 202 or on separate controller boards 208, 308. In some embodiments, for reasons of manufacturability and modularity, all control electronics may be placed on separate PCBs, while PCBs containing LEDs contain only LEDs and contacts. This concept is illustrated in FIGS. 12 and 13, which are, respectively, a top plan view and a side elevational view of an LED array PCB 400 connected to a control board 402, in this case by a number of metal pins 404 that provide both mechanical and electrical connection.

The LED array PCB 400 includes LEDs 22 and contact traces 26. The control board 402 contains control electronics, generally indicated at 406. As with other embodiments, the surface-mounted components on the control board 402 are mounted to its underside, relative to the location of the LEDs 22, in order to allow one LED array PCB 400 to be mounted immediately adjacent to another without a gap.

The LED array PCB 400 would generally be a flexible PCB, as with other embodiments of the invention. However, depending on the embodiment, the control board 402 itself may be either a flexible PCB or a rigid PCB. If the control board 402 is a rigid PCB, it may be, for example, an FR4 PCB. While FIGS. 12 and 13 illustrate a vertical connection that uses pins 404 to connect the control board 402 and the LED array PCB 400, that is only one way in which the mechanical and electrical connection between the two components may be established. As will be described below in more detail, in other embodiments, other types of connectors may be used, and horizontal or vertical connections may be made.

Figure 12:
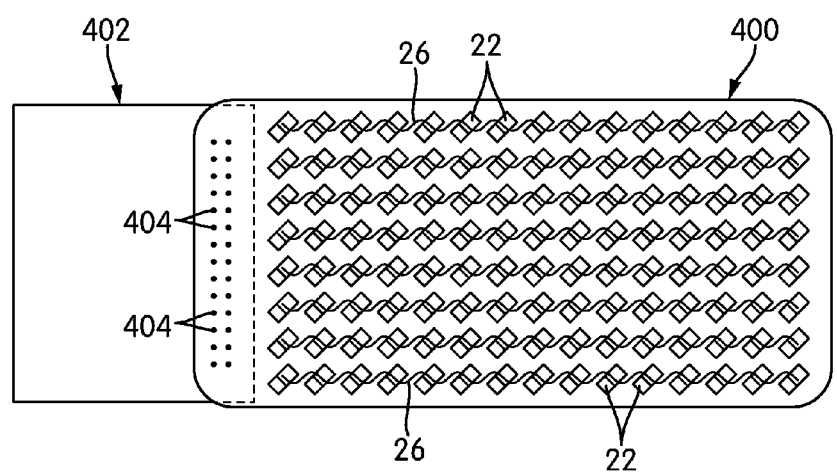
FIG. 12 is a top plan view illustrating the connection of a control board to a light array.
Figure 13:
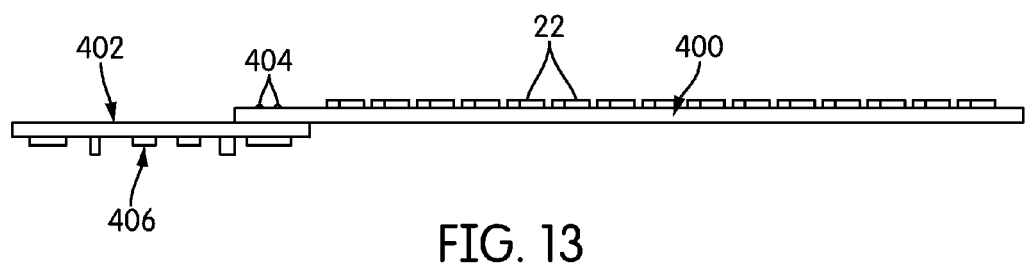
FIG. 13 is a side elevational view illustrating the control board and light array of FIG. 12.

In FIGS. 12 and 13, because the LED array PCB 400 is a lone array, the control board 402 would generally be a fully equipped master control board with communications, external I/O, and programmable capabilities, as described above. However, in situations like that illustrated in FIG. 8, where a number of slaves are connected to a master, only one of the control boards 402 need be fully equipped; the others may omit communication capabilities.

Figure 14:
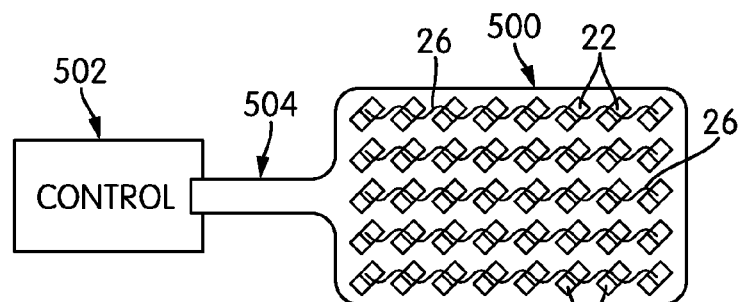
FIG. 14 is a top plan view of a light array connected to a control board according to one embodiment of the invention.
Figure 15:
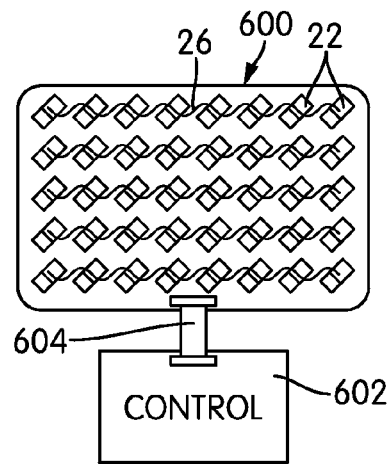
FIG. 15 is a top plan view of a light array connected to a control board according to another embodiment of the invention.

In the top plan view of FIG. 14, a flexible LED array PCB 500 is connected to a control board 502 by means of a thin strip of the flexible PCB material 504 that carries electrical contacts and is, for example, soldered to the control board 502. In the top plan view of FIG. 15, a flexible PCB LED array 600 is connected to a control board 602 by means of a connector 604, such as an FPC connector. The connector 604 connects to a complementary socket that is mounted on each component 600, 602.

In the description above, a control board is attached on one side of a flexible PCB light array. However, in embodiments where the joint between the flexible PCB light array and the control is expected to be subjected to unusual bending stresses or loads, the joint of a single flexible PCB light array, or the joint joining two adjacent flexible PCB light arrays, may be "sandwiched" between two rigid boards, one of which acts as the control board and one of which is a plain board made of, e.g., FR4 material. In that case, the two boards may be riveted together, or secured in some other permanent fashion.

Figure 16:
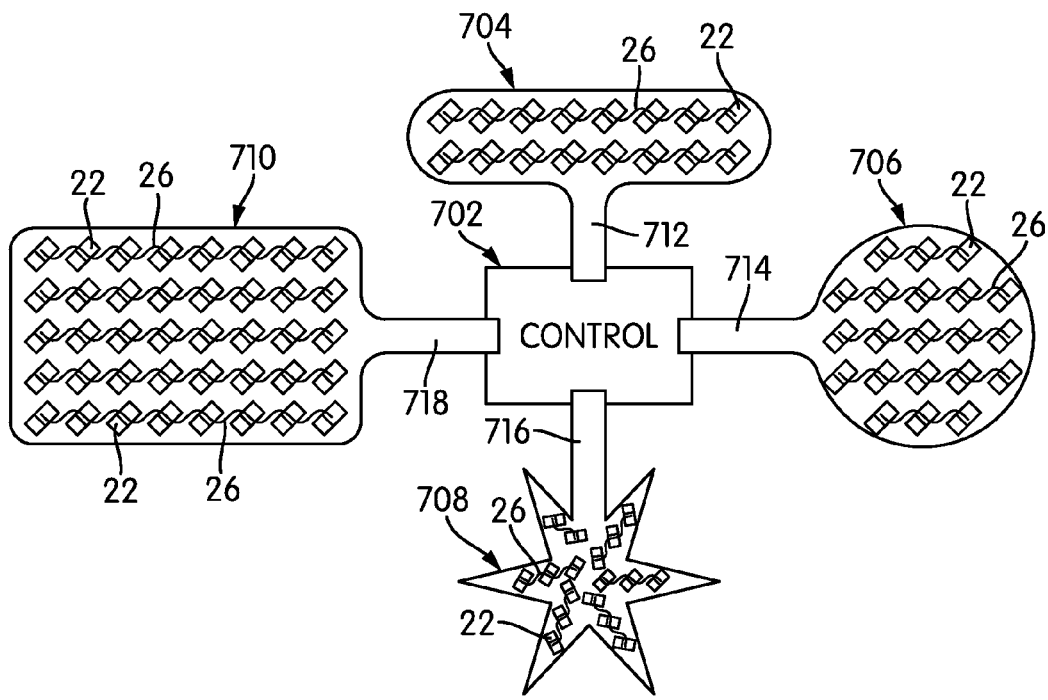
FIG. 16 is a top plan view of a plurality of light arrays connected to a single control board

FIG. 16 is a top plan view of an arrangement according to yet another embodiment of the invention. In the illustration of FIG. 16, a single control board 702 is electrically and mechanically connected to, and controls, four different flexible LED array boards 704, 706, 708, 710. The manner of connection in FIG. 16 is the same as that shown in FIG. 14—thin connecting portions 712, 714, 716, 718 of the respective flexible LED array boards 704, 706, 708, 710 are soldered to the control board 702. However, it should be understood that the manner of connection is not critical, and the arrangement of FIG. 16 could also use connectors, as in FIG. 15.

FIG. 16 also illustrates an aspect of the invention that was described briefly above: the flexible LED array boards 704, 706, 708, 710 may have different shapes. In the illustration of FIG. 16, one board 704 is shaped as an oval, another board 706 is round, yet another board 710 is rectangular with rounded corners, and one board 708 is star-shaped. The boards 704, 706, 708, 710 may have substantially any shape, and as was noted above, the orientations of the LEDs 22 may be altered depending on the directions in which bending and loading are expected. More particularly, if each of the boards 704, 706, 708, 710 is expected to bend in a different way in use, then the orientation of the LEDs on each board 704, 706, 708, 710 may be different. In some cases, as with the star-shaped board 708 of FIG. 16, the orientations of LEDs 22 on different areas of the board 708 may be different.

Although the above description focuses on the use of light arrays 12 in clothing, fabric-encapsulated light arrays according to embodiments of the invention may be included in essentially anything, and may be particularly suited for flexible substrates. For example, fabric-encapsulated light arrays could be incorporated into backpacks and messenger bags.

In the above description, it is assumed that the light arrays 12 extend essentially in two dimensions and are generally flat, at least in neutral position. That need not be the case. For example, light arrays 12 could be installed in belts, suspenders, and other items that include significant curvature in use, and in curved or flexed positions in other items. Light arrays 12 according to embodiments of the invention could also be used in curved chandelier fixtures and in other such designs.

Figure 17:
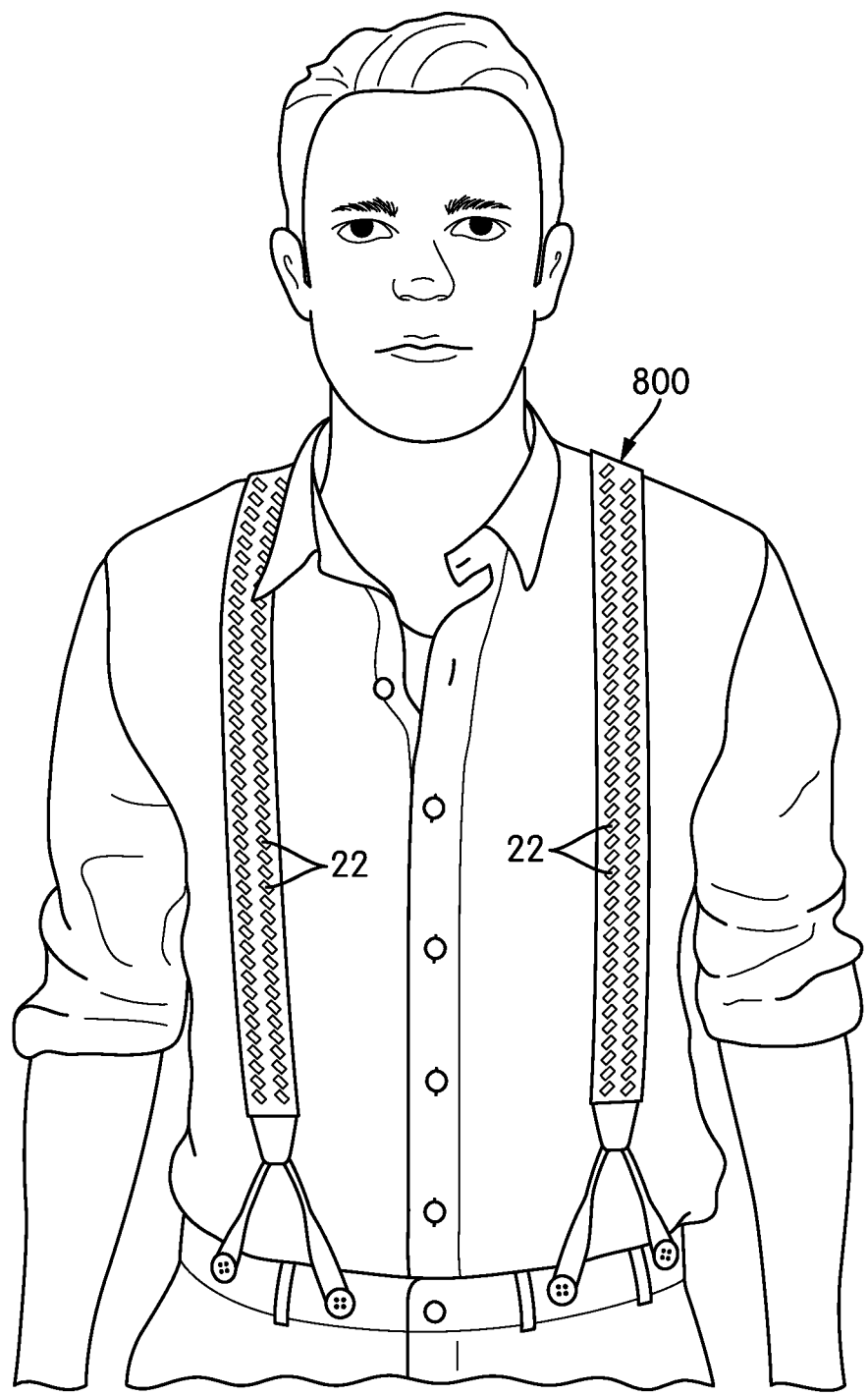
FIG. 17 is a perspective view illustrating a pair of suspenders with installed LED light arrays.

One example of this is shown in FIG. 17, a perspective view illustrating a person wearing suspenders, generally indicated at 800, that include LEDs 22. The LEDs 22 on the suspenders would be placed in flexible PCBs that have the basic features described above with respect to other embodiments. In some cases, the LEDs 22 on each suspender may be part of the same flexible LED array. However, because of the length of the suspenders 800, in many embodiments, the suspenders 800 may use a number of shorter flexible PCBs arranged immediately adjacent to one another in order to create a continuous effect, using the techniques described above. Configurations using multiple PCBs may use the master/slave configurations described above, although because of the flexibility of the suspenders 800, the control boards for the arrays might themselves be flexible.

FIG. 17 illustrates that the LEDs 22 in the front of the suspenders 800 have the 45° angle to the horizontal that is preselected to reduce stresses in all directions. This anticipates bending and flexure in random directions. However, as the suspenders 800 go over the shoulders, the bending of the arrays is generally in a single, known direction. Thus, as the LEDs reach the area that arcs over the shoulders, their orientation may change to horizontal (with respect to the orientation of FIG. 17), or to another orientation that reduces stress in that particular mode of bending.

In the illustration of FIG. 17, two rows of LEDs 22 are shown on each of the suspender braces for ease of illustration. However, the number of LEDs 22 on each of the suspender braces is not limited, and in other embodiments, the number and pitch or density of the LEDs 22 may be increased, limited only by the ability of the control electronics to address and control the individual LEDs 22.

Much of the description above assumes that a flexible LED array has a "neutral" position that is generally flat, and that that array is flexed in use. That is certainly the typical situation when an LED array is incorporated into clothing. However, LED arrays according to embodiments of the invention may be used more broadly, and in some situations, LED arrays may be designed to be typically or permanently curved. Permanent curvatures may be achieved in a number of ways, including by bending an initially flat LED array.

(Of course, in that case, the orientation of the LEDs 22 on the PCB 13 would be chosen for the direction of bending.)

Figure 18:
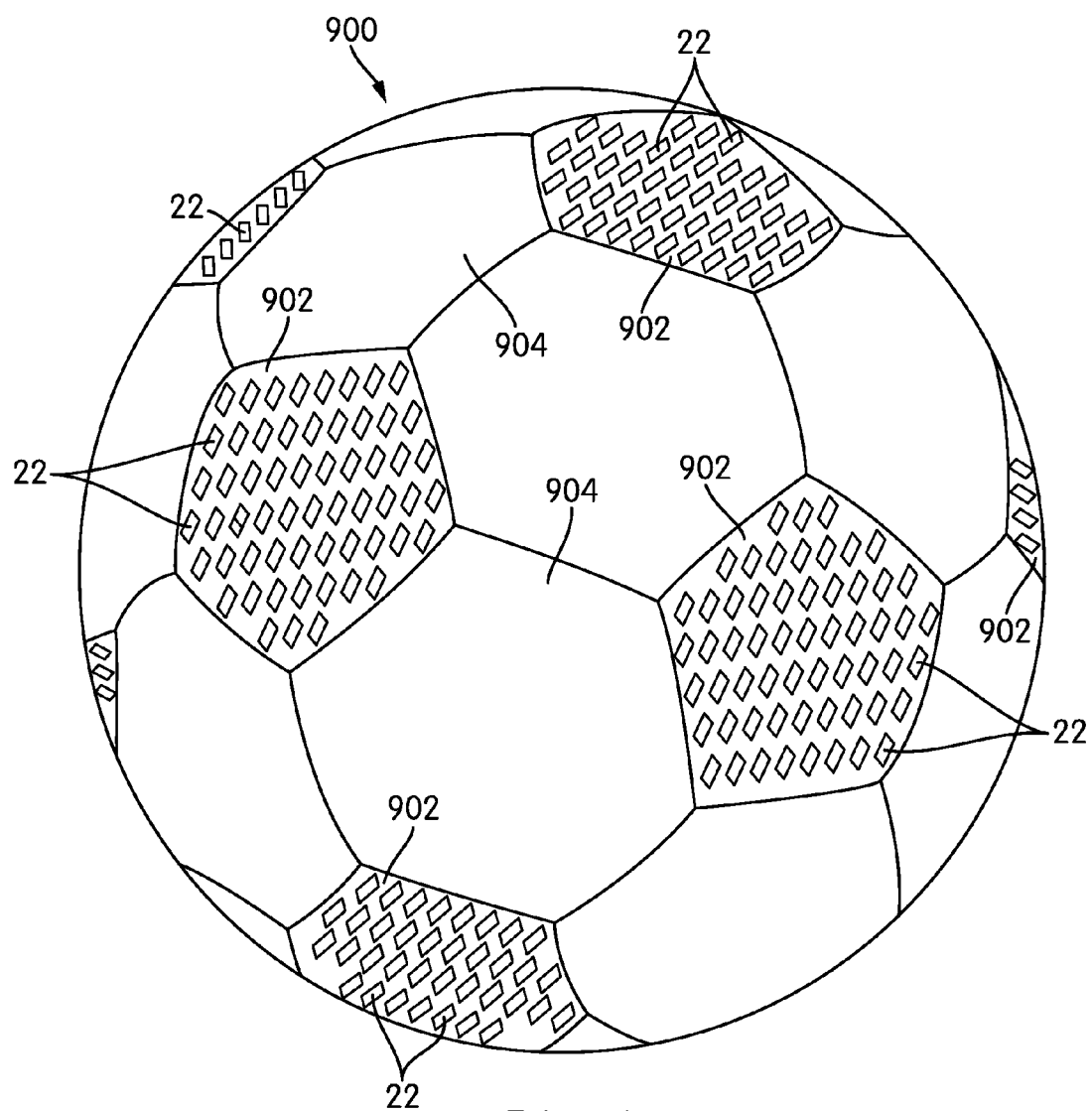
FIG. 18 is a perspective view of a ball with installed LED light arrays.

In some embodiments, discrete and slightly curved or convex PCBs of a polygonal or other shape may be joined together to create continuous curvature, or may be joined with other materials to create continuous curvature. For example, FIG. 18 illustrates a ball 900. An outer layer of the ball 900 comprises a plurality of generally pentagonal segments 902 containing flexible PCB light arrays of a corresponding pentagonal shape that carry LEDs 22. The segments 902 carrying LED arrays are connected to plain hexagonal segments 904 to complete the ball 900, although in other embodiments, both pentagonal segments 902 and hexagonal segments 904 may carry LEDs 22. The control boards are not shown in the view of FIG. 19, but would generally be arranged under and/or to the sides of the active segments 902. Power and other necessary elements would typically be located inside the ball or sphere.

While the invention has been described with respect to certain embodiments, the embodiments are intended to be illuminating, rather than limiting. Modifications and changes may be made within the scope of the invention.

What is claimed is:

1. A flexible light array, comprising:
 a flexible printed circuit board (PCB) having at least one metallization layer and at least one covering layer;
 one or more substantially sinusoidal contact traces defined on the at least one metallization layer and extending from a control circuit area to traverse a length of the flexible PCB;
 a plurality of light-emitting diodes (LEDs) attached to the PCB along the one or more substantially sinusoidal contact traces such that each of the LEDs is oriented at an acute angle with respect to a horizontal line drawn through a length of the respective contact trace to which the LED is attached to minimize stresses in one or more expected directions of bending, and electrical and physical contact between each LED and one of the substantially sinusoidal contact traces is made in a rigidified area defined by a footprint of the LED; and
 control circuitry associated with the PCB such that it is in electrical communication with the substantially sinusoidal contact traces and the LEDs.

2. The flexible light array of claim 1, wherein the flexible light array is encapsulated in a flexible pocket comprising:
 a first layer of a flexible pocket material; and
 a second layer of flexible pocket material disposed atop the first layer of flexible pocket material and secured to the first layer of fabric to form a light array pocket sized to receive the flexible light array.

3. The flexible light array of claim 2, wherein the first and second layers of flexible pocket material are conductive.

4. The flexible light array of claim 3, wherein the first and second layers of flexible pocket material are attached to the light array by a layer of conductive adhesive.

5. The flexible light array of claim 1, wherein the acute angle comprises about 45°.

6. The flexible light array of claim 1, wherein the control circuitry is integrated into the flexible PCB in a control circuit area.

7. The flexible light array of claim 1, wherein the control circuitry is on a separate PCB electrically and mechanically connected to the flexible PCB.

8. The flexible light array of claim 1, wherein the flexible PCB includes a plurality of through-holes for ventilation.

9. An article of clothing, comprising:
 one or more sheets of flexible material configured and sewn or bonded to cover at least a part of a human body;
 one or more light array pockets fixed, connected, or sewn into the one or more sheets of flexible material, each of the one or more light array pockets including a first layer of pocket material, and a second layer of pocket material disposed atop the first layer of material and secured to the first layer of material to form a pocket;
 at least one light array disposed in each of the one or more light array pockets, the at least one light array including
  a flexible printed circuit board (PCB) substrate having at least one metallization layer and at least one covering layer,
  one or more substantially sinusoidal contact traces defined on the at least one metallization layer and extending from a control circuit area to traverse a length of the flexible PCB,
  a plurality of light-emitting diodes (LEDs) attached to the PCB along the one or more substantially sinusoidal contact traces such that each of the LEDs is oriented at an acute angle with respect to a horizontal line drawn through a length of the respective contact trace to which the LED is attached to minimize stresses in one or more expected directions of bending, and electrical and physical contact between each LED and one of the substantially sinusoidal contact traces is made in a rigidified area defined by a footprint of the LED,
  control circuitry mounted associated with the PCB such that it is in electrical communication with the substantially sinusoidal contact traces and the LEDs.

10. The article of clothing of claim 9, wherein the first and second layers of pocket material comprise a flexible, conductive fabric.

11. The article of clothing of claim 10, wherein the at least one light array is adhered to the first and second layers of pocket material with an adhesive.

12. The article of clothing of claim 11, wherein the adhesive comprises a conductive adhesive, such that the conductive first and second layers of pocket fabric act as a Faraday cage or shield.

13. The article of clothing of claim 12, wherein a non-conductive adhesive is used in at least a portion of the area of the at least one light array so as to define an area penetrable by electromagnetic signals.

14. The article of clothing of claim 9, wherein the at least one light array comprises at least one electrical contact pad coupled to the control circuitry that has an enlarged surface area relative to the same feature defined on a standard rigid PCB.

15. The article of clothing of claim 9, wherein the control circuitry comprises:
 a microprocessor;
 a memory coupled to the microprocessor;
 one or more LED drivers coupled to the microprocessor; and
 at least one transceiver coupled to the microprocessor.

16. The article of clothing of claim 15, further comprising a controller in communication with the control circuitry via the at least one transceiver, the controller being adapted to communicate to the control circuitry words, images, and video for display on the at least one light array substantially in real time.

17. A system for local and wide-area control of light arrays embedded in articles, comprising:
   at least one flexible article, including
      one or more light array pockets including a first layer of pocket fabric, and
   a second layer of pocket fabric disposed atop the first layer of fabric and secured to the first layer of fabric to form a pocket;
      at least one light array disposed in each of the one or more light array pockets, the at least one light array including
         a flexible printed circuit board (PCB) substrate having at least one metallization layer and at least one covering layer,
         one or more substantially sinusoidal contact traces defined on the at least one metallization layer and extending from a control circuit area to traverse substantially the entirety of a length of the flexible PCB,
         a plurality of light-emitting diodes (LEDs) attached to the PCB along the one or more substantially sinusoidal contact traces such that each of the LEDs is oriented at an acute angle with respect to a horizontal line drawn through a length of the respective contact trace to which the LED is attached to minimize stresses in one or more expected directions of bending, and electrical and physical contact between each LED and one of the substantially sinusoidal contact traces is made in a rigidified area defined by a footprint of the LED, and
      control circuitry associated with the PCB such that it is in electrical communication with the substantially sinusoidal contact traces and the LEDs; and
   a local controller in communication with the at least one light array through the control circuitry, the local controller being adapted to communicate words, images, and video for display on the at least one light array substantially in real time.

18. The system of claim 17, wherein the system comprises a plurality of the garments.

19. The system of claim 18, further comprising a wide-area controller adapted to transmit coordinated words, images, or video to the control circuitry of the light arrays.

20. The system of claim 19, wherein the coordinated words, images, or video comprise the same words, images, or video to each of the light arrays.

21. The system of claim 19, wherein the coordinated words, images, or video comprise individual portions of a larger word, phrase, image, or video.

* * * * *